US005732624A

United States Patent [19]
Karlyn et al.

[11] Patent Number: 5,732,624
[45] Date of Patent: Mar. 31, 1998

[54] ANNULAR SHAPED SILK SCREEN MEMBER FOR SILK SCREEN PRINTING HALFTONES

[75] Inventors: William M. Karlyn, Lynnfield; David A. Scher, Groveland, both of Mass.

[73] Assignee: Autoroll Machine Company, LLC, Middleton, Mass.

[21] Appl. No.: 635,734

[22] Filed: Apr. 22, 1996

Related U.S. Application Data

[63] Continuation of Ser. No. 512,770, Aug. 9, 1995.
[51] Int. Cl.⁶ .............................. B41F 15/36; B41F 15/38
[52] U.S. Cl. .................................. 101/127.1; 101/128.1; 101/DIG. 36; 38/102.1
[58] Field of Search .............................. 101/114, 127, 101/127.1, 128, 128.1, 128.4, DIG. 36; 38/102.1, 102.2, 102.91; 112/103

[56] References Cited

U.S. PATENT DOCUMENTS

| | | | |
|---|---|---|---|
| 4,047,480 | 9/1977 | Vassiliou | 101/123 |
| 4,254,707 | 3/1981 | Lambert et al. | 101/127.1 |
| 4,509,423 | 4/1985 | Kluck | 101/127.1 |
| 4,561,177 | 12/1985 | Rancer | 38/102.2 |
| 4,568,455 | 2/1986 | Huber et al. | 101/127.1 |
| 4,706,583 | 11/1987 | Darbenzio | 112/103 |
| 4,998,471 | 3/1991 | Harrington | 101/126 |
| 5,144,899 | 9/1992 | Allen | 112/103 |

*Primary Examiner*—Stephen R. Funk
*Attorney, Agent, or Firm*—Herbert L. Gatewood

[57] ABSTRACT

Silk-screens of annular-shape are provided for the silk-screen printing of halftones on compact discs. The silk-screens are rotatably provided in a carrier so that the angle at which moiré can be eliminated or at least minimized or localized for the printing of a particular color can be determined. Following the determination of that angle for each of the colors to be printed, the screens are each then provided with photosensitive emulsion, exposed to light, and washed. The silk-screens are then placed in another carrier at the same angle as before determined for the elimination or at least the mimimalization or localization of moiré, this carrier being capable of being placed directly into the nest of a print head of a conventional silk-screen printing machine.

29 Claims, 6 Drawing Sheets

ANNULAR SHAPED SILK SCREEN MEMBER FOR SILK SCREEN PRINTING HALFTONES

This application is a continuation of application Ser. No. 08/512,770 filed Aug. 9, 1995.

BACKGROUND OF THE INVENTION

(1). Field of the Invention

This invention relates, in general, to silk-screen printing. More particularly, the invention relates to silk-screen members used in a multicolor half tone silk-screen printing process, such as the four-color silk-screen printing or the surface of a compact disc, and to the method of manufacture of those silk-screen members.

(2). Description of the Prior Art

Silk-screen printing, in general, involves the use of a screen, i.e., a woven mesh fabric, stretched over a frame and the design or text to be printed is provided on the screen in outline form, in the nature of a stencil. The design to be printed is provided in the silk-screen, in general, by coating the screen with a photosensitive emulsion, exposing the emulsion to obtain the desired image and then washing the unexposed areas to leave the screen with the image to be printed. The design or text is reproduced on a desired object, e.g., the surface of a compact disc, by having a squeegee force color, i.e., ink, through the mesh of the exposed areas of the screen. Thus, the image or text printed comprises a plurality of closely spaced dots of color.

Half-tone printing, contrary to full color printing, involves a shading or gradation of color. In such printing, the gradation of the tone of color is obtained by a system of closely spaced dots arranged in parallel lines. For example, in the four color printing of the surface of a compact disc, this involves the separate printing, in turn, of a line of dots of cyan, black, magenta, and yellow of full color. These lines of dots of different color must be printed at predetermined angles, i.e., the angles of color separation, and in proper linear registration with one another to provide the desired gradation of color and to prevent moiré. The angles of color separation depend to some extent upon the particular printing process involved, i.e., offset, silk-screen, etc. It is important that the three darkest colors involved, i.e., magenta, black, and cyan be at angles 30° apart from one another, i.e., 15°, 45°, and 75°, respectively. The yellow color separation should desirably be at either 0° or 90°. An almost endless number of color tints can be obtained by combining these four basic colors. As is known by those skilled in the ad of silk-screen printing, these angles of color separation follow the so-called "North American" standard. These angles, at which lines of dots of color should be printed in halftone printing, do not necessarily, however, provide the ideal solution for silk-screen printing. Many silk-screen printing operators have developed their own color separation angles that work with the mesh counts usually used in silk-screen printing processes.

Registration of the lines of printed dots to one another to provide a suitable halftone presents no particular problem in printing processes other than in silk-screen printing. In the case of silk-screen printing, the proper registration of the lines of dots of color being printed is of particular concern. Otherwise, "moiré" occurs. Moiré can result for several reasons, as is well known to those skilled in the art of silk-screen printing. Nevertheless, perhaps the major reason is the fact that the line of dots of one or more of the color separations may not be provided at the desired angle. Thus, for example, in the first color being printed, if the angle of the dots being printed is only slightly different from the angle of color separation for that color, moiré will occur even though the other lines of dots of color are printed at the correct angles of color separations. Or, on the other hand, the first color printed may be at the correct angle of color separation, and one or more of the subsequent colors printed is printed at an improper angle.

Moiré manifests itself in a series of vertical lines, i.e., lines of dots of color, being in one direction, spaced apart from one another, and at an angle somewhat different from that desired. These lines present an unsuitable shimmering pattern or wave-like appearance in the gradation of color on the object being printed. Moiré is a particular problem in the four-color silk-screen printing of objects, e.g., the surface of a compact disc. In this case, each of the four halftone screens used in the printing process must have the mesh in the screen af the proper angle, to avoid the moiré effect.

Heretofore, the manner of eliminating, or af least reducing, moiré in silk-screen printing has been most difficult. Changing the angle or size of the screen, i.e., the mesh count of the woven fabric used in the manufacture of the screen, usually solves the problem. Nevertheless, the manufacture of a silk-screen for halftone printing is a somewhat costly and labor intensive operation. Where moiré occurs, the making of a new set of screens, e.g., four screens in the case of four color process printing, with different color separation angles or with a different mesh woven fabric, or both, merely compounds this expense for a printer.

The conventional manner of manufacturing a silk-screen for use in the printing of halftones involves a number of individual steps. The first step is to make color separations of the halftone image involved. This is done at a predetermined line count, preferably at a line count of 120 lines of dots of color per inch, as such gives some latitude in the choice of a woven fabric for use in making a silk-screen. The color separations may be made by either the printer or the manufacturer of the silk-screens; however, it is generally made by the printer. Where the color separations are made by the printer, the silk-screen manufacturer nevertheless confirms the half tone line count for each of the color separations made.

In general, the confirmation of line count involves the placement of each color separation or film positive, in turn, on a light table having a single point incandescent light, e.g., a 60 watt bulb. On placing a film positive on light table, the crop marks provided in the film positive, at 3, 6, 9 and 12 o'clock, are lined up, in usual manner, with those provided on the light table. Then, the film positive is taped in place, emulsion side up. A conventional halftone calculator is then rotated in usual manner on top of each of the color separations. The largest moiré effect visually observed indicates the line (or dot) count. This process is repeated for each of the colors involved.

Next, using a conventional Star Guide Orientator, the halftone angle for the lines of dots of color for each color separation is determined. This is done, in general, by rotating the Star Guide on top of a film positive until the moiré effect is again obvious. This indicates the angle of color separation for that particular color. The same light source is used for the color separation angle determination, as for the line count. In general, as earlier mentioned, the preferred angles for color separation are cyan (75°), black (45°), magenta (15°), and yellow (90° or 0°).

Next, one determines the proper thread count for the halftone silk-screen printing to be done, i.e., the thread count of the woven fabric to be used in the manufacture of a silk-screen whereby the effect of moiré will be eliminated, or at least reduced. This is done by reference to a conventional chart showing the relationship between halftone line count and the thread count of a woven fabric and moiré. In general, the higher the thread count, the least likely that moiré will result, even over a relatively large range of halftone line count. For example, at a thread count of 465 threads/inch, there is little possibility that moiré will result even at a halftone line count varying from 85 lines/inch to 133 lines/inch. Af a line count of 120 lines/inch, there is little likelihood of moiré occurring af a mesh count of either 420 or 465 mesh/inch. Having determined the line count for the color separations, one then chooses that mesh woven fabric for manufacture of silk-screens least likely of result in moiré.

The next step is to determine the angle of mesh for each of the color separations at which moiré can be least detected by visual observation. This is done, in general, by laying a 90° screen, i.e. the warp and weft threads are at 90° relative to the rectangular-shaped frame of the screen, of the right mesh size over the taped positive on the light table. The screen is then totaled by hand until moiré can no longer be detected, or af least until moiré is localized and minimized. The rotation of the screen for moiré to be no longer detected or to be localized or minimized may need be done in some cases in a clockwise direction, and in other cases in a counterclockwise direction. A conventional protractor is then used to measure the angle, i.e., the angle of mesh, that a "moiré free" screen varies from the starting position, and in which direction. This procedure is followed for each of the colors involved.

A suitable size woven fabric, square cut, and of the thread count previously determined, is then located in conventional stretching apparatus and stretched according to usual techniques. In general, this is accomplished by grabbing each of the four edges of the fabric with an elongated stretching bar, i.e., the warp threads terminating in, for example, opposed end edges are stretched in opposite directions, and the weft or fill threads terminating in opposed side edges are stretched in opposite directions. The screen fabric should be stretched to a tension of at least about 16–18 newtons, an even higher tension being more desirable. Importantly, however, all the screens to be used in, e.g. a four color printing process, must be at a consistent tension.

Once the woven fabric Is stretched to the extent desired, silk-screen frames corresponding in number to the desired color separations made are placed In contact with the bottom surface of the stretched fabric. Each frame is then oriented In usual manner on the stretched fabric at the desired angle, i.e., the angle at which it was previously determined, as above disclosed, that moiré could no longer be detected. This orientation is accomplished, in general, by means of a conventional protractor placed along an edge of the frame. Adhesive commonly used in the manufacture of silk-screens is then applied to the top surface of the stretched fabric, after which it seeps downwardly through the mesh of the woven fabric to the top surface of the screen frame. The stretched fabric is thus adhered to the silk-screen frame. This process is repeated for each of the colors involved in the color separation.

The screens are then each provided with the halftone image to be printed by that screen. This is done, in general, by first applying a photosensitive emulsion to the screen. A film positive, e.g., of the color separation of cyan, is then placed against the emulsion and the emulsion is exposed, for example, by ultraviolet light. The unexposed areas of the emulsion are then washed out in conventional manner. This procedure is repeated for each of the color separations. The screens are then ready to be used In a silk-screen printing operation.

Thus, It can be seen that the conventional manner in which silk-screens are manufactured involves a considerable number of steps. Moreover, the determination of the angles for the mesh of the woven fabric relative to the screen frame to be used in the manufacture of a set of silk-screens for halftone printing, as earlier described, and rotating of the chosen woven fabric or film positives until it appears to the human eye that moiré is eliminated, or at least more localized, is largely a hit and miss proposition. The same is true with respect to the rotation of a screen frame to be adhered to the stretched woven fabric. As will be appreciated, these procedures depend to a large extent upon the eyes of the person aligning the film positives or woven fabric relative to one another, and the accuracy of the placement of the protractor. The carry over of that angle to tile placement and orientation of screen frames on the stretched fabric using a protractor further compounds the problem.

More recently, a much improved process for the manufacture of silk-screens for use in the printing of halftones has been discovered, such a process being disclosed in Appln. Ser. No. 08/419,038, filed on Apr. 10, 1995 now U.S. Pat. No. 5,562,030, and assigned to Autoroll Machine Corporation, the same as is this application. the disclosure of that patent application is fully incorporated herein by reference. In general, in the process of silk-screen manufacture disclosed, the angle at which the mesh of a woven fabric should be, relative to the screen frame, whereby to eliminate or at least minimize or localize moiré is predetermined for each of the color film separations, using an off-line registration apparatus, as disclosed in that patent. This apparatus is provided with an annular-shaped rotatable member on which the 90° screen frame is mounted. The apparatus is further provided with an indexing scale whereby the angle to which the screen is rotated af which moiré is eliminated or minimized and localized is readily determined. Thus, this off-line registration apparatus eliminates the inherent potential inaccuracies of using a protractor, as earlier disclosed.

The angle for each of the screens of which moiré is eliminated or at least minimized or localized is then carried to stretching apparatus for the woven fabric to be used in the manufacture of the silk-screens. The stretching apparatus is provided with a horizontally disposed table located below the woven fabric in which is provided a plurality of annular-shaped rotatable members each of which is provided with an indexing mark or member which mates with a scale. A silk-screen frame is mounted on a rotatable member for each of the colors involved, e.g. in four color process printing, four frames and rotatable members are involved. Subsequent to the mounting of a screen frame on a rotatable member, the rotatable member is then rotated to the desired angle, as previously determined in the off-line registration process, for that particular color separation. Thus, the screen frame is oriented to provide the frame at the right angle relative to the mesh of the woven fabric to manufacture a silk-screen whereby moiré is eliminated or at least minimized or localized in the silk-screen printing process. The woven fabric is then stretched to the desired tension and the table is raised so as to provide the top surface of each of the screen frames in contact with the woven fabric. The fabric is then adhesively secured to a screen frame in usual manner. The mesh in the woven fabric is thus provided at the correct angle of color separation for each of the colors involved. The stretched fabric is then cut at the outer perimeter of each of the screen frames providing silk-screens ready for further processing to provide them for use in a silk-screen printing operation.

Although this last mentioned manner of manufacture of silk-screens for use in the printing of halftones is a substantial improvement over the conventional method used theretofore, as earlier disclosed, its use is, nevertheless, attendant with certain disadvantages. One disadvantage results from the fact that screen frames used in this manner of manufacture of silk-screens are of a square or rectangular shape. Thus, as the screen frames need be necessarily spaced apart from one another of a certain extent to provide for the annular-shaped rotatable members on the table, only a limited number of silk-screens can be manufactured from any given size woven fabric. Another disadvantage in the manner of manufacture of silk-screens as disclosed in Appln. Ser. No. 08/419, 038 now U.S. Pat. No. 5,562,030, is that the angle at which the screen frames each need be oriented relative to the stretched fabric must first be determined, and then the screen frames must each then be oriented at that angle relative to the mesh of the stretched fabric by rotation of the rotatable member on which the screen frame is mounted on the table in the stretching apparatus.

Thus, it is highly desirable that an improved method for the providing of a set of silk-screens for use in the multicolor silk-screen printing of halftones, whereby moiré can be eliminated, or at least localized and minimized, be provided. Further, It is desired to provide an even more simplified method of providing silk-screens for use In the printing of halftones on compact discs.

SUMMARY OF THE INVENTION

The present invention has as a primary object the providing of a set of silk-screens for use in the multicolor silk-screen printing of halftones on a flat surface not attendant with the problems and disadvantages in the manufacture of such silk-screens heretofore.

Another object of the invention is to provide a novel silk-screen member that functions like a silk-screen and can be used ill the printing of halftones.

A further object of the invention is to provide a silk-screen member for use in the printing of halftones that can be located directly in the conventional printhead of a silk-screen printing apparatus during setup.

A further object of the invention is to provide a silk-screen member which comprises the combination of a silk-screen and a carrier therefor wherein the mesh of he silk-screen are provided at the desired angle of color separation.

A further object of the invention is to provide apparatus to be used in the manufacture of silk-screens for use in the silk-screen member of the invention whereby such apparatus results in an improved method for the manufacture of silk-screens to be used In halftone printing.

A still further object of the invention is to provide improved means for determining the angle at which the mesh in a woven fabric screen need be provided in a silk-screen printing operation whereby moiré is eliminated or at least minimized and localized.

A still further object of the invention is to provide a more simplified method for determining the angle that the mesh must be provided to eliminate or af least minimize and localize moiré in the silk-screen printing of halftones.

A still further object of the invention is to provide a more simplified method for providing the mesh in a silk-screen at the correct angle to eliminate or at least minimize and localize moiré in the silk-screen printing of halftones.

An even further object of the invention is to provide a method of providing the mesh in the woven, stretched fabric in a silk-screen at the angle at which moiré is eliminated or at least minimized and localized in halftone printing that is determined off-line and apart from the stretching operation.

A still further object of the invention is to provide an improved method for the manufacture of a set of silk-screen members to be used in halftone printing whereby moiré is at least minimized or localized.

Quite advantageously, the providing of silk-screens according to the invention makes good utilization of the stretched fabric from which the screens are made. Moreover, the silk-screens provided according to the invention allows every screen made to be used for any color separation angle desired, Other objects and advantages will become apparent from the disclosure which follows hereinafter.

BRIEF DESCRIPTION OF THE DRAWING

For a better understanding of the present invention and its preferred embodiments, reference should be made to the following detailed description which is to be read In conjunction with the accompanying drawings, in which.

DETAILED DESCRIPTION OF THE INVENTION AND THE PREFERRED EMBODIMENTS THEREOF

While the present invention will be described hereinafter with particular reference to the accompanying drawings, it is to be understood at the outset that it is contemplated that the present invention may be varied in specific detail from that illustrated and described herein while still achieving the desirable characteristics and features of the present invention. Accordingly, the description which follows is intended to be understood as a broad enabling disclosure directed to persons skilled in the applicable ads and is not to be understood as being restrictive.

Figure 1:
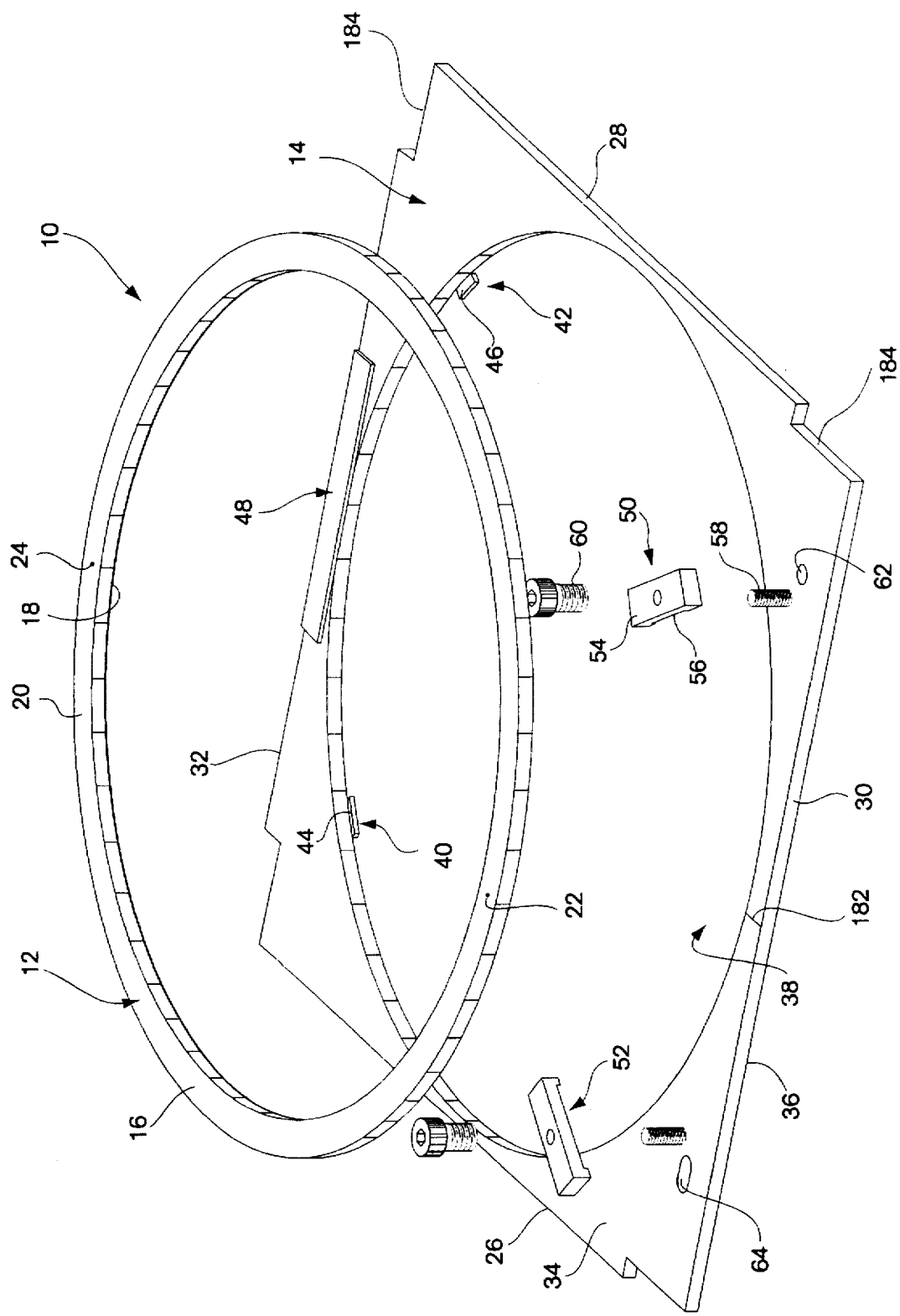
FIG. 1 is an exploded view in perspective of a silk-screen member according to the invenllon comprising in combination a silk-screen comprising a circular-shaped screen of woven fabric (the woven fabric not being shown in the drawing for sake of clarity) and an annular-shaped silk-screen frame, and a square-shaped carder for the silk-screen, the silk-screen member being ready for installation info the nest of a printhead of a silk-screen printing machine.

Turning now to FIG. 1 of the drawing there is shown therein a silk-screen member 10 according to the invention comprising the combination of a circular-shaped silk-screen 12 and a carrier 14 for the silk-screen. The silk-screen 12 comprises an annular-shaped silk-screen frame or ring member 16 defined by inner and outer diameters and by top and bottom planar surfaces 18, 20, to the top surface 18 (the bottom surface as shown in FIG. 1) of which is adhesively secured a stretched woven fabric (not shown) according to conventional techniques, hereinafter more fully disclosed. The stretched woven fabric is of a circular shape and of the same diameter as the outer diameter of the annular-shaped screen frame 16. On the bottom surface 20 of the screen frame 16 there are provided indexing marks or dots 22, 24, the purpose for which will later be made clear. These indexing marks can be other than dots, if desired. For example, linear marks can be inscribed in the surface of the frame, such marks lying on a diameter of the annular-shaped frame. Or the indexing marks provided on the screen frame can take the form of dimples provided in the frame, or circular-shaped openings provided therein. Nevertheless, whatever the form of the indexing marks, the important thing is that such be in opposition to one another and lie on a diameter of the annular-shaped screen frame. Index marks, it will be better appreciated later on, need also be provided on the top surface of the screen frame, these being in direct opposition to the index marks 22, 24.

The carrier 14 shown in FIG. 1 is of a square shape; however, it can be of other shapes, If desired. For example, in some cases, the carrier 14 may be of rectangular shape. The shape of the carrier will depend somewhat upon the configuration of the nest of the print head in which the silk-screen member is to be placed. The carrier 14 is defined by linear side edges 26, 28 and linear front and back end edges 30, 32 and by top and bottom planar surfaces 34, 36. The carrier 14 is further defined by a circular-shaped opening 38 which defines a peripheral edge. The circular-shaped opening 38, as will be appreciated from FIG. 1, is of a diameter only slightly larger than the outer diameter of the annular-shaped screen frame 16. Thus, the screen frame will fit into the circular-shaped opening 38, and be capable of being rotated therein.

Extending inwardly from the peripheral edge of the circular-shaped opening 38, their are provided tabs 40, 42 defined by horizontally disposed planar top surfaces 44, 46. The tabs prevent the silk-screen frame 16 from falling through the circular-shaped opening 38 and, importantly, provide the woven mesh screen in the same plane as that defined by the bottom surface 36 of the carrier 14. Thus, it will be appreciated by those skilled in the art that the horizontally disposed surfaces 44, 46 of the tabs lie in a plane parallel to and somewhat lower than the plane defined by the top planar surface 18 of the screen frame 12. As shown in FIG. 1, the tabs 40, 42 are located at about 10 and 2 o'clock, respectively, considering that the opening 38 defines the circular-shaped face of a clock, and 6 o'clock is closest to the viewer. On the top surface 34 of the carrier, there is provided a stop member 48, the purpose for which will soon be made clear. Stop member 48 is of rectangular shape and is fixedly secured to the carrier along the end edge 32. The length and width of the stop member can vary somewhat, as desired. As will be seen from FIG. 1, the stop member is of a width to provide an overlapping of the screen frame when such is located in the carrier. Also, the stop member is so located that half of its length is on one side of 12 o'clock, and the other half of the length is on the other side of 12 o'clock. The important thing, however, is that such member, in combination with the tabs 40, 42, maintain the silk-screen 12 in horizontal disposition, and provide the bottom surface 20 of the screen frame in the same horizontal plane as that defined by the top surface 34 of the carrier, and the plane of the woven fabric screen in that plane defined by the bottom surface 36 of the carrier.

Although not shown in the drawing, it will be appreciated by those skilled in the art that four tabs can be provided, if desired, In such event, these other two tabs will be desirably located at about 8 and 4 o'clock. Further, it will be recognized by those skilled in the ad that slop member 48 need not necessarily be of rectangular shape. The stop member can be, for example, of arcuate shape, if desired, the straight edge of which is provided along the end edge 32. The main consideration is that such a member overlap the bottom surface of the annular-shaped screen frame so as to maintain the screen frame in horizontal disposition.

Of critical Importance in the providing of a silk-screen member 10, according to the invention, the carrier 14 must be provided with means to lock the silk-screen frame 12 in position so that the mesh in the woven fabric screen are maintained at the angle determined earlier, as later fully disclosed, to prevent moiré in the silk-screen printing of a substrate, e.g., the top surface of a compact disc. Such locking means can take various forms; however, the locking means 50, 52 shown in FIG. 1 will be found quite suitable for the intended purpose. The locking means 50, 52 are identical in construction and only one will be more fully described. Locking means 50 comprises, in combination, a latch member 54, in which is provided an opening 56, an externally threaded member 58, and an Internally threaded member 60. The externally threaded member 58 extends perpendicularly upwardly from the top surface 34 of the carrier, In operation, the bottom portion of the internally threaded member 60 extends through the opening 56 and is screwed onto the externally threaded member 58. The top portion of the member 60 is of a larger diameter than that of the opening 56 thereby allowing the latch member to be securely fastened against the top surface of the carrier and the bottom surface 20 of the screen frame 12. It will be appreciated that the locking means disclosed is like that conventionally used to fasten storm door windows to the storm door frame. Also, those skilled in the art will readily appreciate that the member 60 can be externally threaded at its bottom end and an internally threaded bore provided in the carrier 14. Other locking means will also be found satisfactory provided they perform the intended function disclosed.

The carrier 14 is provided with openings 62, 64, as is shown in FIG. 1, these openings being spaced apart from one another to the same extent and of the same size and shape as are the openings provided in a square- or rectangular-shaped silk-screen frame conventionally used in a silk-screen printing apparatus. Thus, to this extent, carrier 14 functions like a conventional silk-screen frame. As a result of this, the silk-screen member 10 can be, quite advantageously, directly placed into the nest of the silk-screen printing head according to usual techniques during setup of the silk-screen printing apparatus for a particular run.

As will be readily appreciated by those skilled in the art of silk-screen printing, the dimensions of the carrier 14 will be determined by the printing head being used. The inner diameter of the annular-shaped screen frame 16 will be varied accordingly, the main consideration being that, in any case, the inner diameter of the screen frame must be such as to allow the flood bar to make a complete pass.

Figure 2:
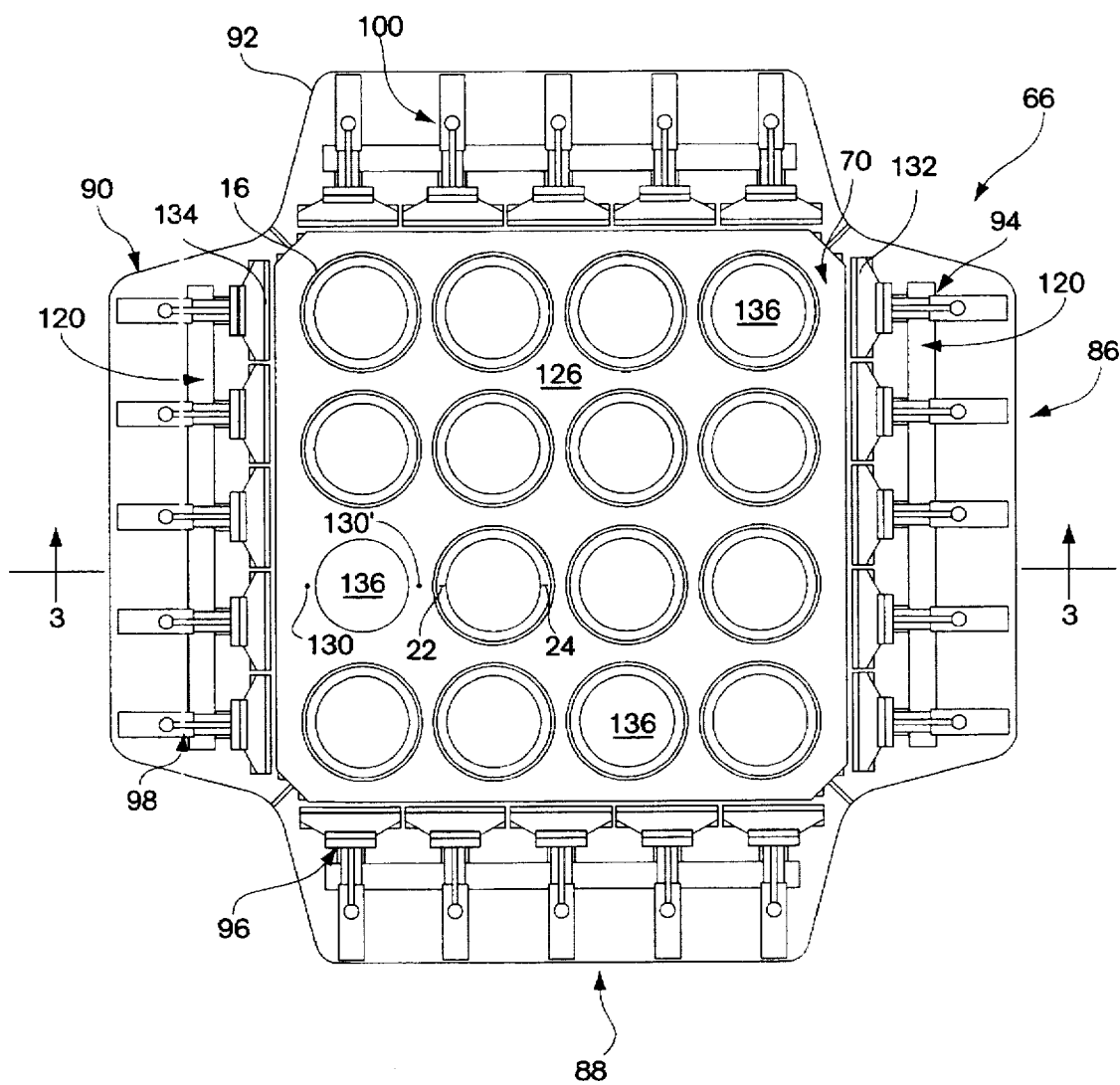
FIG. 2 is a top plan view of stretching apparatus according to the invention for the stretching of woven fabric used in the manufacture of circular-shaped silk-screens of the invention but without a woven fabric being shown so that the horizontally disposed table on which the annular-shaped screen frames are placed for manufacture of the circular-shaped silk-screens can more readily be seen.
Figure 3:
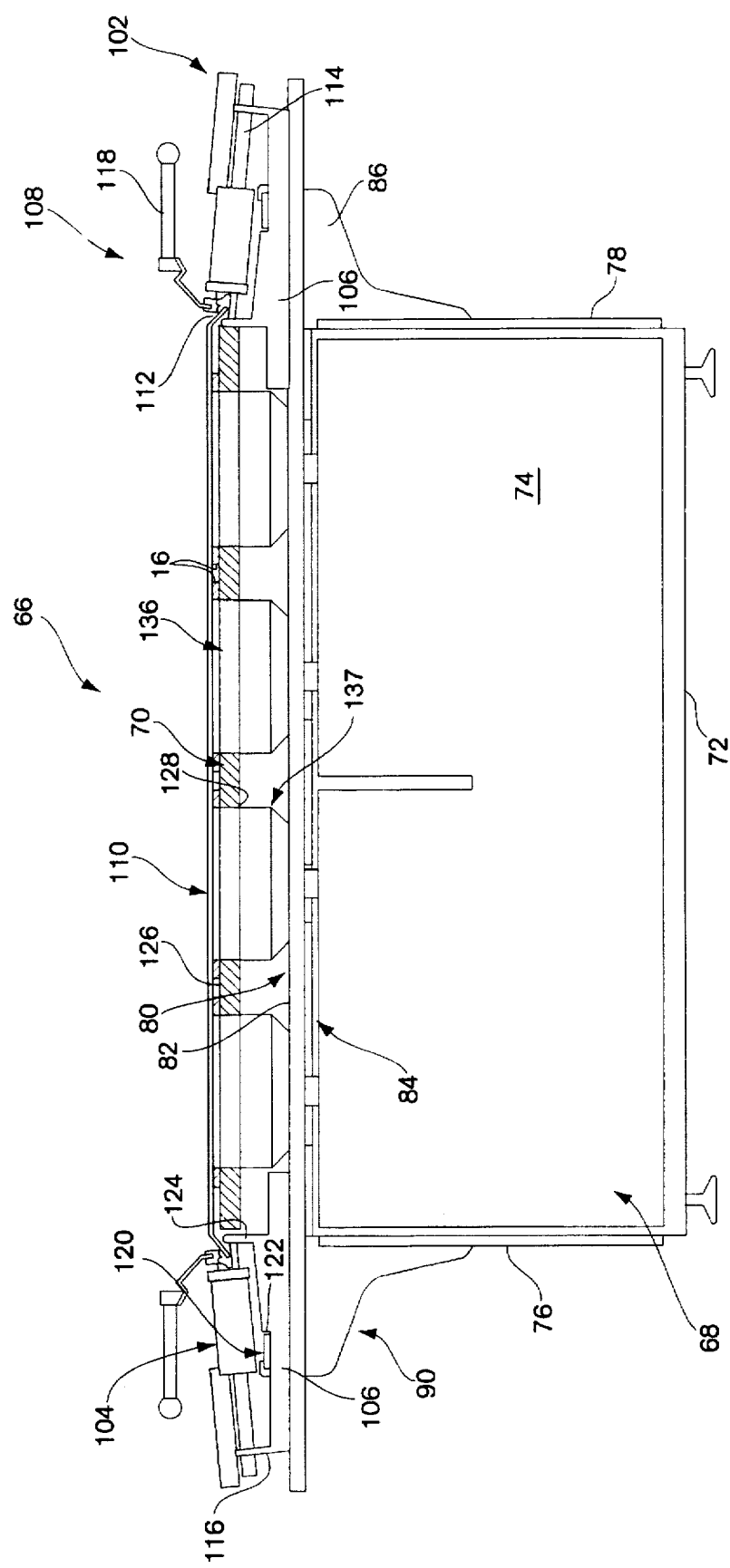
FIG. 3 is a cross-sectional view of the stretching apparatus shown in FIG. 2 taken af secant lines 3—3 and showing the fabric located in opposed stretching means.
Figure 3A:
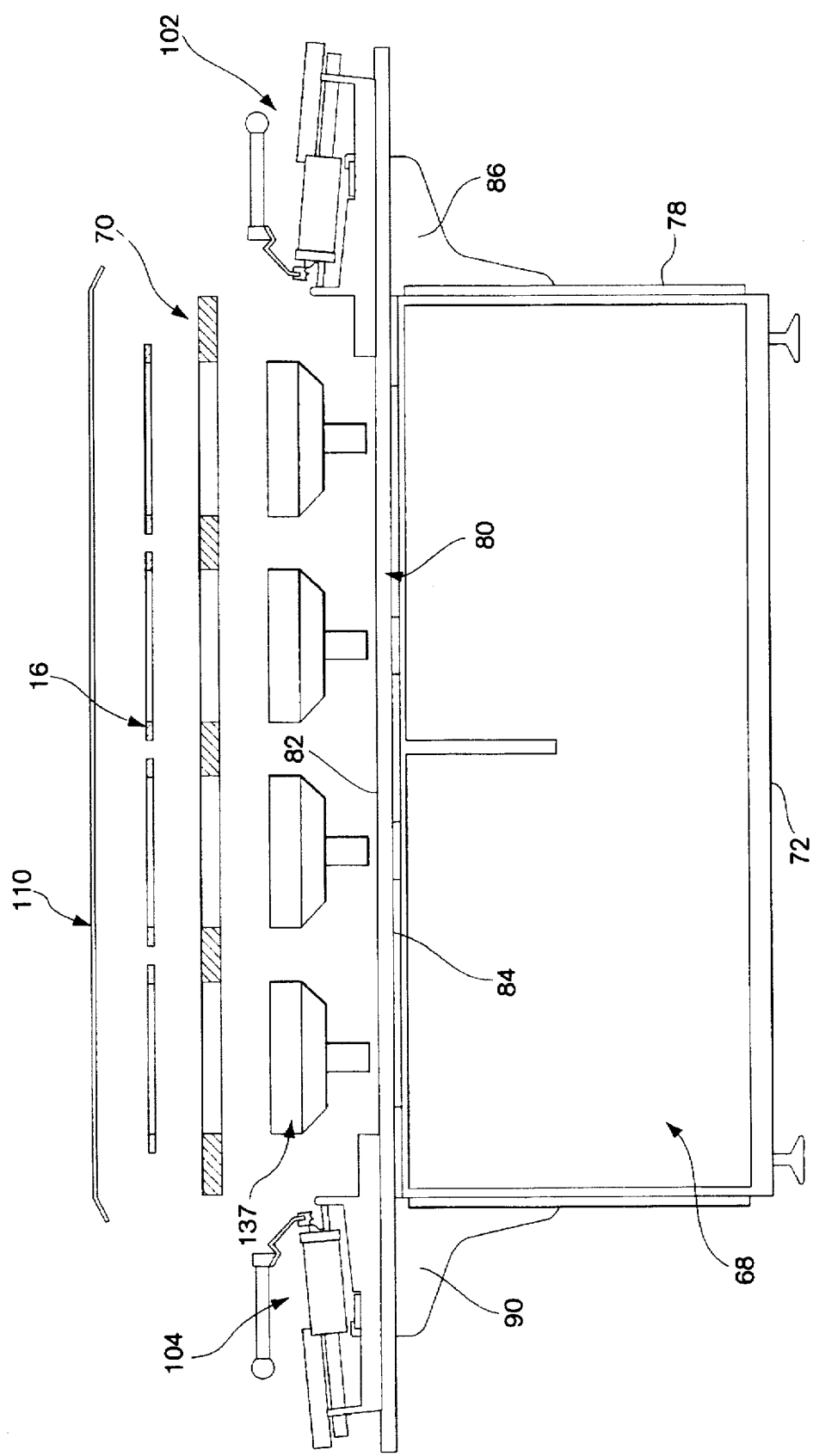
FIG. 3A is an exploded view of the cross-section shown in FIG. 3, to better show the relative locations of the woven fabric of be stretched, the annular-shaped screen frames, and the support member for the screen frames.

Turning now to FIGS. 2 and 3, there is shown therein stretching apparatus 66 of largely conventional design, except for the base member 68 and the horizontally disposed planar support member 70, both of which will soon be more fully described. In general, the stretching apparatus 66 used in the practice of the invention comprises a bottom or base member 68 of a box-like configuration defined by a horizontally disposed closed bottom end 72 and spaced-apart, vertically upright, parallel end walls, only one of which, end wall 74, is shown in the drawing, and parallel side walls 76, 78, these walls intersecting af 90 degree angles, respectively, to one another. Thus, there is provided an internal cavity of cubic shape, the purpose for which cavity will be later made clear.

Attached to the top end of the base member 68 and providing a closure therefor is a horizontally disposed member or platform 80 which lies in a plane parallel to that of the bottom end 72. The member 80 is defined by planar top and bottom surfaces 82, 84. As will be seen from the drawing, the member 80 is defined by extensions 86, 88, 90, and 92, the top surfaces of which are in the same horizontal plane as the top surface 82 of the top closure member 80. The extensions 86, 88, 90, and 92 each support clamping means designated generally by reference numerals 94, 96, 98, and 100, respectively. The clamping means each comprises a plurality of conventional Tetko pneumatic clamps or clamping members, identified in general by reference numeral 102. These clamping members are available commercially from TETKO INC. of Briarcliff, New York under the trade designation #SST Clamp.

As the clamping members 102 are of identical construction, only one will be further described herein. In general, the clamping members, as best seen in FIG. 3, each comprises a head 104 and a clamp base 106, the clamp base 106 being defined by a horizontally disposed flat surface which is supported on the top surface of an extension. The head 104 of a clamping member is provided, af its front end, with a locking clamp 108 whereby the warp and weft edges of the unstretched fabric 110 to be stretched can be securely gripped. The locking clamp 108 is moveable toward and away from engagement with the fabric holding member 112 whereby the edges of the fabric can be gripped securely for stretching and then released, when desired.

Each clamping member head 104 comprises a piston (not shown) provided with a connecting piston rod 114 the free end of which extends through an opening In a piston rod support member 116 which extends upwardly from the outer end of the clamp base 106. The piston rod in each of the clamping member heads is fixedly secured in the respective piston rod support member 116 thereby allowing the head 104 of a clamping member to be moved in a back and forth direction. Thus, the clamping members in opposition to one another can be caused to move toward and away from one another, as desired. Although not shown In the drawings, those clamping members in opposition to one another, e.g., the clamping members 102 provided in the clamping means 94 and those in clamping means 98, are connected to conventional pressure means whereby an equal amount of pressure can be supplied to each of the clamping members.

The clamping members, in and of themselves, and their operation and location in the stretching apparatus, need not be further described herein, it is believed, as such forms no pad of the invention disclosed herein. Other clamping means can be used in the practice of the invention. The only thing of importance is that the clamping means for stretching the woven fabric be arranged in a square pattern, as the woven fabric being stretched is of a square shape, i.e., the warp and weft threads of the woven fabric terminate in ends that define spaced-apart parallel linear side and end edges that intersect with one another at 90 degree angles. Thus, the ends of the warp and weft threads that define these side and end edges are engaged by the clamping members.

To prepare a woven fabric 110 for stretching, in general, the ends of the warp and weft threads of the fabric 110 are provided on the holding members 112 of the respective clamping members 102. Then, an operator engages a clamp handle 118 and, by hand, raises it upwardly and pushes it forward whereby to clamp securely, onto the thread ends located on the holding member. This is done for each of the clamping members whereby the edges of the fabric are securely engaged. Next, pressure is applied to the clamping member pistons whereby to cause the head of opposed clamping members 102 to move away from one another thereby providing the desired amount of tension on the fabric. The clamping base 106 of each of the clamping members 102 in a clamping means, e.g., those clamping members 102 In clamping means 94 (FIG. 2), are held to the top surface of an extension by an elongated bridging member or slat 120. As will be readily appreciated from FIG. 2, a slat 120 is mounted to a support member extension whereby to be in perpendicular disposition to the lengthwise direction of a clamp base 106. The front edge of a slat 120 is located against a shoulder or stop member 122 provided on the top surface of a clamp base 106 (FIG. 3). Although not shown in the drawings for sake of clarity, and because the clamping members are commercially available and are not a pad of the invention in and of themselves, a clamp head 104 rides in a hack which causes a clamp head to maintain a linear back and forth movement. The backward movement of a clamp head is such that It is limited lo the back edge of a slat 120. Each clamp base 106 is provided af its front end with a vertically disposed stop member 124, the purpose for which is primarily for safely reasons. Thus, in the event there should be a failure in pressure, the clamp members will be prevented from going forward beyond this point, Although, if is common practice that the same pressure be applied to all the clamping member pistons, that need not necessarily be the case. The pressure supplied to the stretching apparatus 66 can be different for opposing stretching means, For example, a predetermined pressure can be supplied to those opposed clamping members In clamping means 94, 98 and a lesser or greater predetermined pressure applied to those opposed clamping members in clamping means 96, 100. Accordingly, if is most preferred in the practice of the invention that pressure be applied independently to the he opposed clamping means. The means for doing such can be readily accomplished by those skilled in the art. Thus, in the event that such is desired, different tensions can be applied to the warp and weft threads.

It makes no difference, however, in setting up the stretching apparatus 66 for the stretching of the fabric 110 which of the clamping means clamps which edges, i.e., the ends of the warp threads or the ends of the weft threads. The important consideration is that the fabric be square to the square shape defined by the clamping means.

Although, as shown In FIG. 2 of the drawing, the clamping means each comprises five (5) clamping members, this is not necessarily critical in the practice of the invention. The clamping means may each include a greater or lesser number of clamping members. This will depend somewhat upon the size fabric involved and the width of the clamping member chosen. In the practice of the invention, with a plain weave fabric size of 61"×61", 5 clamps (10" wide clamps) will be found to give quite satisfactory results in the stretching of the woven fabric. As will readily be appreciated by those skilled in the art, and as earlier disclosed, other stretching means comprising other clamping members may also be used in the practice of the invention, provided they accomplish the function intended herein.

Located below the fabric 110 and between the fabric and the top surface 82 of the platform or member 80 (FIG. 3), and this is a critical feature of the invention, there is provided a horizontally disposed table or support member 70 defined by top and bottom planar surfaces 126, 128 (FIG. 3). The support member 70 is disposed horizontally so that the top planar surface 126 of the support member is provided parallel to the horizontally disposed plane defined by the stretched fabric 110. The support member 70 is mounted according to conventional techniques (not shown) so as to be movable vertically upwardly and downwardly, toward and away from the bottom surface of the fabric 110, the reason for which soon be made clear. This can be accomplished by various means known to those skilled in the ad, e.g. crank operated hydraulic lifts or by pneumatic means, as desired. In general, four hydraulic lifts will be provided for raising and lowering of the support member, and these will be provided in such locations as to better ensure that the support member 70, in its raised position, is provided in a horizontal plane and parallel to that plane defined by the stretched fabric 110.

As will be seen from FIG. 2 of the drawing, a plurality of spaced-apart index marks, referred to generally by reference numeral 130, are provided on the top surface 126 of the horizontally disposed table 70, in predetermined spaced-apart locations. These index marks, as shown in the drawing, are located on a straight line extending between, and perpendicular to, the parallel side edges 132, 134 of the table 70. Although not shown in the drawing, a row of spaced-apart index marks 130 will be provided on the surface of the table for each of the rows of annular-shaped screen frames 16 provided on the table. In this case, it will be seen that four rows of screen frames are provided, each row comprising four screen frames, arranged in vertical columns thereby providing a square pattern of screen frames. Next adjacent index marks in a row, e.g. index marks 130 and 130', should be spaced-apart a distance a little greater than the outside diameter of the annular-shaped screen frame, the reason for this soon being made clear, if not already obvious. The index marks 130 can take various forms, e.g. dimples in the table surface, painted dots provided on the surface, + marks, etc., provided they accomplish the intended purpose, as later more fully disclosed. It will be appreciated by those skilled in the art that index marks can be provided on the table surface in both horizontal rows and vertical columns, if desired, in this case, the index means for location of the annular-shaped screen frames can, if desired, be intersecting lines that extend between the side edges and end edges of the table. Although not shown in the drawing, indexing marks can, if desired, be provided af the linear side edges of the table 70, or at the linear end edges, or on both the side and end edges.

The table 70 is further defined by a plurality of openings indicated generally by reference numeral 136, these providing communication with the internal cavity defined by the side and end walls of the base member 68 by means of funnel-like members denoted generally by reference numeral 137. The bottom of the funnelike members extend through openings provided in the top closure of the base member. Although not shown in the drawing, as such forms no pad of the invention disclosed herein, conventional vacuum means are connected to the internal cavity whereby to rid the cavity of toxic fumes as later disclosed.

The manufacture of the circular-shaped silk-screens of the invention is accomplished by first placing a plurality of annular-shaped screen frames 16 on the top surface 126 of the table 70. These annular-shaped screen frames, as will be seen by reference to FIG. 2, are arranged in a plurality of horizontal rows and vertical columns of screen frames, four screen frames being provided in each column and row shown in the drawing. The screen frames are arranged in a square pattern, a screen frame having both a row and column address. The annular-shaped screen frames 16 are provided in close proximity to one another, the peripheral edge defined by the outer diameter of a screen frame being almost in tangential contact with the peripheral edge of a next adjacent annular-shaped screen frame. In locating the screen frames on the table 70, and this is critical to the practice of the invention, the opposed index marks 22, 24 of a screen frame will be aligned with opposed, next adjacent index marks 130 provided on the table. This can be accomplished by visually lining up the index marks.

Although not earlier disclosed, and not shown in FIG. 2, the index marks provided on the annular-shaped screen frame and those provided on the table 70 supporting the screen frames can take the form of circular-shaped openings. The openings provided in the table 70 as index means should be spaced apart the same distance as the index marks provided in the screen frame. In this case, the openings in the screen frame can be aligned with adjacent and corresponding openings provided in the table and a pin-like member can be then inserted into the aligned openings. Thus, quite advantageously, the screen frames can be maintained in the properly registered locations on the table until adhered to the stretched fabric, as later disclosed. As will be appreciated by those skilled in the art, the head of such a member must be located below the plane defined by the top surface 18 of the screen frame. One can readily accomplish this by providing that the openings in the screen frame be provided with a thread pattern. Then, an elongated threaded member having a thread pattern on a part of its length can be screwed into the two openings in the screen frame, making sure that the top of the elongated member is below the top surface of the screen frame. The bottom ends of the elongated pin-like members, which are free of threads can be located in the openings provided in the table. When the screens are removed from the stretching table, as later disclosed, the threaded pin members can then be removed from the bottom side of the screen. This can be facilitated by providing a groove in the bottom end of the pin-like member, like that provided in the head, whereby a screw driver can be used to remove the pin-like member from the screen frame.

Of advantage in the practice of the invention disclosed herein, it will be seen that with the same size stretching apparatus and woven fabric (61"×61") used in the manufacture of silk-screens, according to the method disclosed in U.S. Pat. No. 5,562,030, earlier disclosed, the use of an annular-shaped screen frame, rather than a square-shaped frame, allows a greater number of silk-screens to be made at any one time. Of even greater advantage, however, the use of annular-shaped screen frames in the manufacture of silk-screens, allows such a silk-screen to be used ill any angle desired in a silk-screen printing process. This will become more clear later.

The stretching apparatus 66 used in the practice of the invention, as earlier disclosed, is preferably provided with means (not shown) for independently or simultaneously controlling the tension provided on the warp and weft threads. Thus, referring to FIG. 2 of the drawing, the distance between the opposing clamping means 94, 98 is made greater or less, if desired, than that between the clamping means 96, 100, to provide the tension desired on the warp or weft threads of the woven fabric 110, as the case may be. The means for accomplishing such a function can be readily provided by one skilled in the art. For example, pneumatic means (not shown) can be provided to control the separation between opposed clamping means, hence the tension on the warp and weft threads.

Once the screen frames 16 are properly located and aligned on the table 70, a woven fabric 110 (e.g. a plain weave 465 mesh count woven fabric) is cut into a 61" square and the warp and weft edges thereof placed an the surfaces of the fabric holding members 112 of the clamp members 102. This fabric can be cut before the screen frames are located on the supper member, if desired. The particular sequence is of no particular importance.

The fabric used in the manufacture of silk-screens is typically a polyester fabric as such has good elongation characteristics which allows the woven mesh fabric to achieve higher tensions, and with a shorter stretch time than with other fabrics. Importantly, the fabric edges are provided square with the lengthwise directions of the clamping means, i.e., the clamping means 94, 98 clamp on the ends of the warp threads of the woven fabric and the clamping means 96, 100 clamp on the opposed ends of the weft threads. It will be appreciated by those skilled in the art, however, that the reverse can be done, if desired. The critical concern is that the ends of the warp and weft threads be substantially square with the square shape defined by the four clamping means of the stretching apparatus. This will, of course, provide that the stretching of the fabric be substantially at 90 degrees. The clamp members 102 in each of the clamping means should desirably be individually operable to allow for adjusting the linearity of the mesh to assure as approximate a 90 degree stretch of the woven fabric as possible.

With any adjustments made as deemed necessary, the warp and weft threads of the woven fabric 110 are ready to be brought to the desired tension, in usual manner. The tensions on the warp and weft threads are increased by increasing the distance between opposed clamping means. Desirably, the tension on the warp and weft threads will be the same. The fabric is generally stretched in two stages. The first stretch should be such as to provide a tension that is slightly more than half (measured in newtons) the final tension desired. The tension at any particular point in the stretching operation can be determined in usual fashion using a conventional tension meter gauge measuring in newtons.

Using a low elongation polyester fabric (e.g. a plain weave fabric, 465 mesh) the final stretch should achieve a tension of about 24 newtons with a relaxed stretch of about 20 newtons. Thus, in the first stage, the woven fabric is brought to a tension of about 12 newtons, after which it is allowed to relax according to usual techniques. As is well known to those skilled in the art, this relaxation period is essential in stretching any fabric comprising polymeric strands due to the molecular structure of the particular polymeric material involved. Otherwise, the fiber strands making up the woven fabric may snap. The relaxation time desired in any particular case depends, at least in pad, upon two variables. One Is the particular fabric provided by different manufacturers. The other is how uniform the stretching is in bringing the warp and weft threads to the desired tension. The relaxation time in any particular case is determined empirically through test stretching, in advance.

Following relaxation of the woven fabric, after having been stretched in the first stage, the fabric is then stretched to full tension. At full tension, the tension af the four corners and in the center of the stretched fabric is checked. This is done to determine whether the overall tension is the same across the entire fabric surface. The tension on both the warp and weft threads in these locations is determined. The tension readings should desirably fall within + or −1 newton to assure that all screen frames will be compatible when imaged. In any event, those skilled in the art know that to obtain close registration in the silk-screen printing of multiple colors, for example, four color process printing, it is important that any variation in tension across the stretched fabric from which screens are manufactured be kept as low as possible. Where tension is different across the stretched fabric, the result will be silk-screens from that same fabric with different tensions, causing the images on each silk-screen to be stretched differently from one another. Thus, the less the variation in tension, the closer the registration that can be obtained in the printing process.

When the woven polyester fabric has been stretched to the desired tension, the top surfaces 18 of the annular-shaped screen frames 16 provided on the horizontally disposed support member 70 are then placed in contact with the stretched fabric. This is accomplished by causing the support member 70 to be raised vertically upwardly until the top surfaces of the screen frames 16 are each slightly pressed against the bottom surface of the stretched woven fabric 110. The screen frames should, of course, be of a rigid material, e.g., steel frames. It is important, of course, that the screen frames 16 used be planar without any bowing therein and that the frames each be seated on the support member 70 to lie flat against the top surface 126 of the support member. Otherwise, the stretched fabric may not be properly adhered to the annular-shaped screen frames.

At this time, adhesive is applied in usual manner to that portion of stretched fabric in opposition to the top surface 18 of an annular-shaped screen frame 16. Thus, a small bead of cyanoacrylate adhesive is typically applied to the stretched fabric such penetrating through the woven fabric strands by capillary action and the mesh of the fabric to the top surface of the screen frame contacting the bottom surface of the stretched fabric. The adhesive can be, if desired, troweled so as to ensure penetration through the meshes in the fabric and to provide a layer of adhesive on the surface of the screen frame. The accelerator for the cyanoacrylate adhesive is then sprayed onto the stretched woven fabric according to usual techniques whereby the adhesive is cured to provide a tight bond between the stretched woven fabric and the surface of the screen frame. Each frame is secured in the same manner to the stretched woven fabric. Those skilled in the art will appreciate that other adhesives may be used instead of a cyanoacrylate adhesive, if desired. Further, the means of application may also differ, for example, a layer of adhesive can be applied directly to the screen frame prior to the screen frame being placed in contact with the stretched fabric. Nevertheless, the adhesive used and manner of application earlier disclosed will be found to produce quite satisfactory results and is preferred in the practice of the invention.

The toxic fumes from the adhesive bonding operation, as earlier disclosed are caused to be drawn into the internal cavity of the base member 68. Thus, as will be appreciated by those skilled in the art, this is caused by the vacuum communicating with the internal cavity provided in the base member and the openings 136 provided in the support member 70. The openings 136 can individually communicate with the cavity in the base member or the openings can communicate with a manifold member that, in turn, communicates with the cavity in the base member. Those skilled in the art can readily provide either construction, as desired.

Quite advantageously, as the height of the support member 70 is adjustable, this allows for the woven fabric 110 to be stretched to the desired tension, out of contact with the annular-shaped screen frames 16. Then, the support member 70, with the screen frames located thereon, and properly registered as desired, is raised to provide contact between the stretched woven fabric, i.e. the screen, and the top surface 18 of the screen frame 16. Thus, the screen frame is adhesively secured to the bottom surface of the stretched woven fabric. The screen frames each having been provided on the support member 70 in the desired orientation, i.e., with the index marks 22, 24 on the screen frames in alignment, and forming a straight line from one linear side edge of the support member to the other, will result in the warp or weft threads of the fabric, as the case may be, being in parallel alignment with the diameter of the annular-shaped screen frame on which the index marks 22, 24 lie. Although the screen frames have been disclosed earlier to be provided with only two index marks, four index marks can be provided on each screen frame, if desired. Thus, considering the annular-shaped screen frame as being the face of a clock, index marks can be provided at 3, 6, 9, and 12 o'clock. With four index marks, each screen frame can be oriented with respect to both the warp and weft threads of the woven fabric. In this case, index marks will be provided on the support member 70, In both horizontal rows and in vertical columns.

Once the adhesive has been cured, and the stretched fabric 110 has been adhesively secured to each of the annular-shaped screen frames, the tension on the stretched fabric is then released. The circular-shaped silk-screens 12 are then each removed from the excess fabric by cutting the fabric along the outer peripheral edges of each of the annular-shaped screen frames 16. Thus, the manufacture of the circular-shaped silk-screens is complete. Each of the circular-shaped silk-screens made is like the others, i.e., the warp and weft threads, hence the mesh of the woven fabric is aligned in the same manner relative to the index marks 22, 24 provided on a screen frame. The silk-screens 12 are each then ready to be used in the determination of the angle at which moiré can be eliminated or af least minimized and localized in the silk-screen printing of a particular color of the halftone image of concern, as disclosed hereinafter. Of great advantage, the making of circular-shaped screens, according to the invention, rather than ones of a square or rectangular shape, permits the use of the screens at any angle needed for the elimination of, or at least the minimization or localization of moiré. Further, the process above-disclosed allows the making of four sets of silk-screens at one time to be used in four color process printing. Thus, there is not only better utilization of woven fabric but a savings in cost of labor and material.

Figure 4:
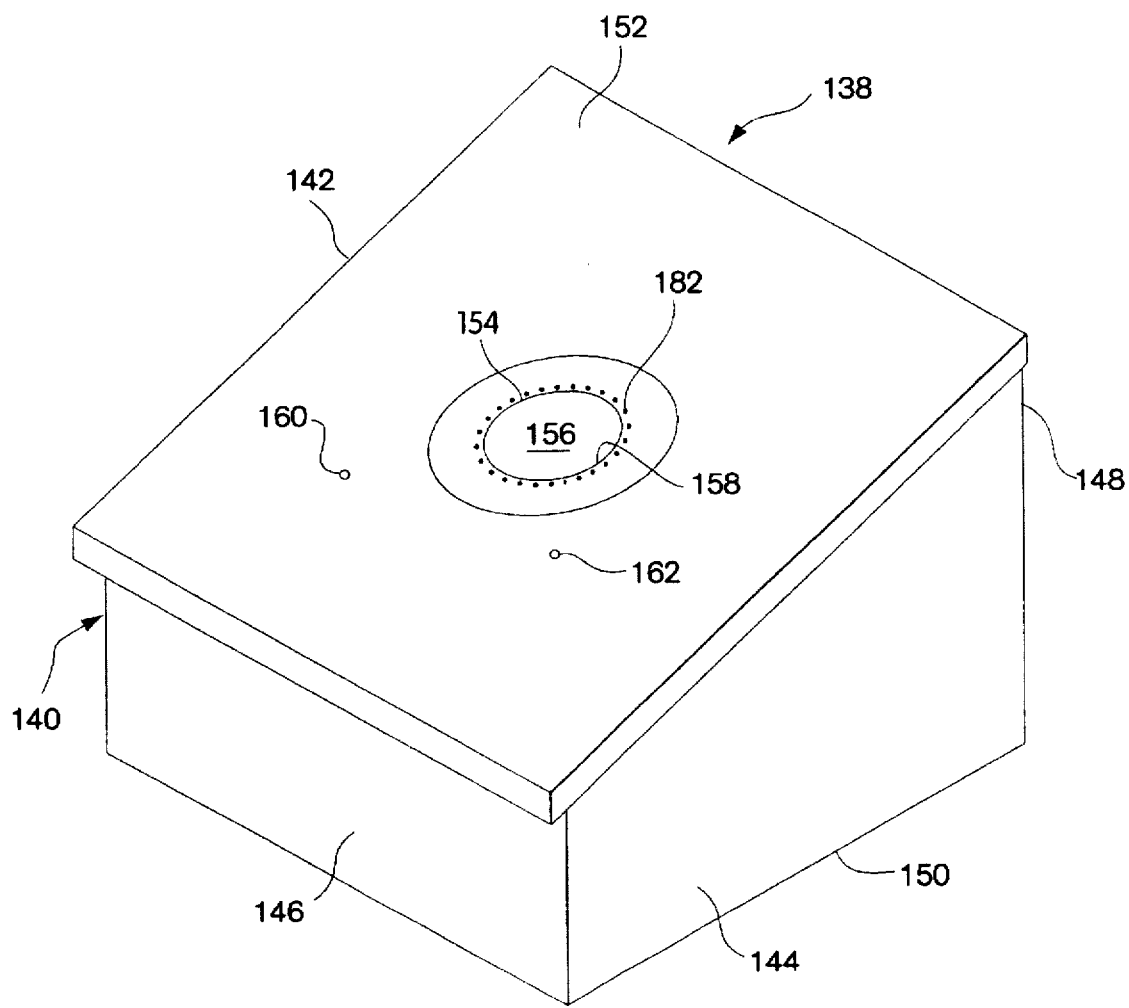
FIG. 4 is a moiré detection device used in the practice of the invention for determining the angle that the mesh in the woven fabric of a circular-shaped silk-screen must be provided relative to the linear side edges of a silk-screen carrier to eliminate or at least minimize and localize moiré.

Referring now to FIG. 4 of the drawing, there is shown therein moiré detection apparatus 138 which provides means for the determination of the angle at which the mesh in a circular-shaped silk-screen 12, earlier disclosed, i.e., the mesh of the stretched woven fabric in the circular-shaped silk-screen, must be located in the silk-screening printing of a halftone image to eliminate or at least minimize or localize moiré. Quite advantageously, contrary to the manner of manufacture of silk-screens heretofore, this angle is determined, and the mesh of the screen are provided at the proper angle in a separate and distinct operation from that of manufacturing the silk screens. Accordingly, this greatly simplifies this determination.

The angle at which moiré can be detected and then eliminated or at least minimized or localized depends largely upon the halftone color separations made and the resulting film positives, as will be later more fully disclosed. The color separations to be made in any particular case will, of course, depend upon the colors in the particular image or artwork to be duplicated, e.g., the artwork, image or information to be silk-screen printed on, e.g., a compact disc (not shown) according to usual techniques.

The moiré detection apparatus 138 comprises a body member 140 of box-like construction defined by vertically upright, spaced-apart side walls 142, 144, parallel to one another and upright, spaced-apart end walls 146, 148, as seen from the drawing. The body member 140 is closed at its bottom end in usual manner by a horizontally disposed planar, bottom member 150 providing means for support of the moiré detection apparatus on a horizontally disposed surface such as a table (not shown). Nevertheless, if desired, the moiré detection apparatus can be integral with the top surface of a cabinet which is provided with a suitable number of drawers for storage of masks, as disclosed later on, color separation film positives, etc.

The top end of the body member 140 is provided with a top closure 152 which preferably, as seen in FIG. 4, tapers downwardly from the back end wall 148 to the front end wall 146. This feature, quite advantageously, allows one to best view a color film positive and moiré relationship, as will be later made more fully clear. Nevertheless, the top closure can be in a plane parallel to that defined by the bottom member of the body member 140, if desired; however, that is less preferred. In the top closure 152, there is provided a centrally located, circular-shaped opening 154 in which is located a plate glass window 156 fixedly secured to the peripheral edge 158 defining the opening. This plate glass window provides means for the centering location of color separation film positives, as later disclosed. The diameter of the circular-shaped opening can vary somewhat; however, an opening 5.25" is most preferred, as such a size opening will be found useful in centering the film positives. Although not shown in FIG. 4, there is located behind the plate glass window an incandescent light providing a single source of light behind the centrally located, circular-shaped opening. A conventional 60 watt bulb will be found quite satisfactory for the purposes of this invention. Thus, the body member 140 functions essentially as a light box for the viewing of the color film positives, as later disclosed.

As will be seen from FIG. 4, two vertically disposed, spaced-apart registration pins 160, 162 are provided on the top closure 152, the purpose for which will soon be made clear. It is of critical importance that these two registration pins be of the same size and in the same spaced-apart location as the registration pins conventionally provided on the mounting bracket for a silk-screen of a silk-screen printing apparatus with which the circular-shaped silk-screens are to be used. As will be appreciated by those skilled in the art of silk-screen printing, the size and location of these registration pins can vary somewhat and will be determined by the screen registration system of the silk-screen printing apparatus in which the circular-shaped silk-screens and screen member 10 are to be used.

The first step in the providing of a silk-screen member 10 according to the present invention, if such has not been done already by the silk-screen printer, is to make the halftone color separations, e.g., make positive films of each of the colors to be printed, i.e., cyan, black, magenta, and yellow of the halftone image to be reproduced on, for example, a compact disc. This is done by techniques well known to those skilled in the silk-screen printing art, the preferred separation being at approximately 120 lines of dots of color per inch.

If the color separations have already been made, e.g., by the printer who is going to be doing the silk-screen printing of, e.g., compact discs, the line count is, nevertheless, confirmed. The reason for this is that an accurate line count is critical to the determination of the angle of the mesh in the silk-screen at which moiré can be eliminated or at least minimized or localized, as disclosed hereinafter. This confirmation can be accomplished in conventional manner by using a commercially available halftone calculator. To do this, the color separations or film positives, provided by the printer are each, in turn, affixed to a light box having a single point incandescent light source (60 watt bulb), and the halftone line count made by the printer operator is confirmed. The line count for the color separation of concern is confirmed, in general, by noting where the greatest effect of moiré occurs. The moiré detection apparatus 138 can be, quite advantageously, used for this purpose. In the event the printer operator has not provided the color separations, such will be made by the silk-screen manufacturer according to conventional techniques.

Nevertheless, regardless of who made the color separations from the halftone image to be printed, it is most preferable that half-tone separations having a line count of 120 be made. With a line count of 120 lines/inch, as well known to those skilled in the printing art, there exists the least possibility for moiré to occur using a woven fabric having a mesh count of either 420 or 465 lines/inch. Even with fabric having a mesh count of 355 or 380, any moiré is usually localized. This information is readily available from a conventional mesh/dot and moiré relationship chart.

Having confirmed, or made as the case may be, the line count for each of the color separations or the color separations themselves, the four color process film positives obtained from the color separations, in the case of four color process printing, are then each employed, in turn, in the moiré detection apparatus, as hereinafter disclosed. This is to determine the angle at which the mesh of the woven fabric, i.e., silk-screen, need be provided in the silk-screen printing process to eliminate, or at least minimize or localize moiré in the silk-screen printing of the particular halftone image. Thus, one of the four color process film positives (not shown) is placed on the plate glass window 156 located in the opening 154 of the top closure 152 with the emulsion side up. Crop or registration marks provided on the color film positive, e.g., at 3, 6, 9, and 12 o'clock, in usual fashion, are aligned with like crop marks provided on the top closure (not shown in the drawing) to provide the color film positive in square disposition with the side walls of the body member 140 and centered over the opening 154. The color film positive so located is then taped in place.

Figure 5:
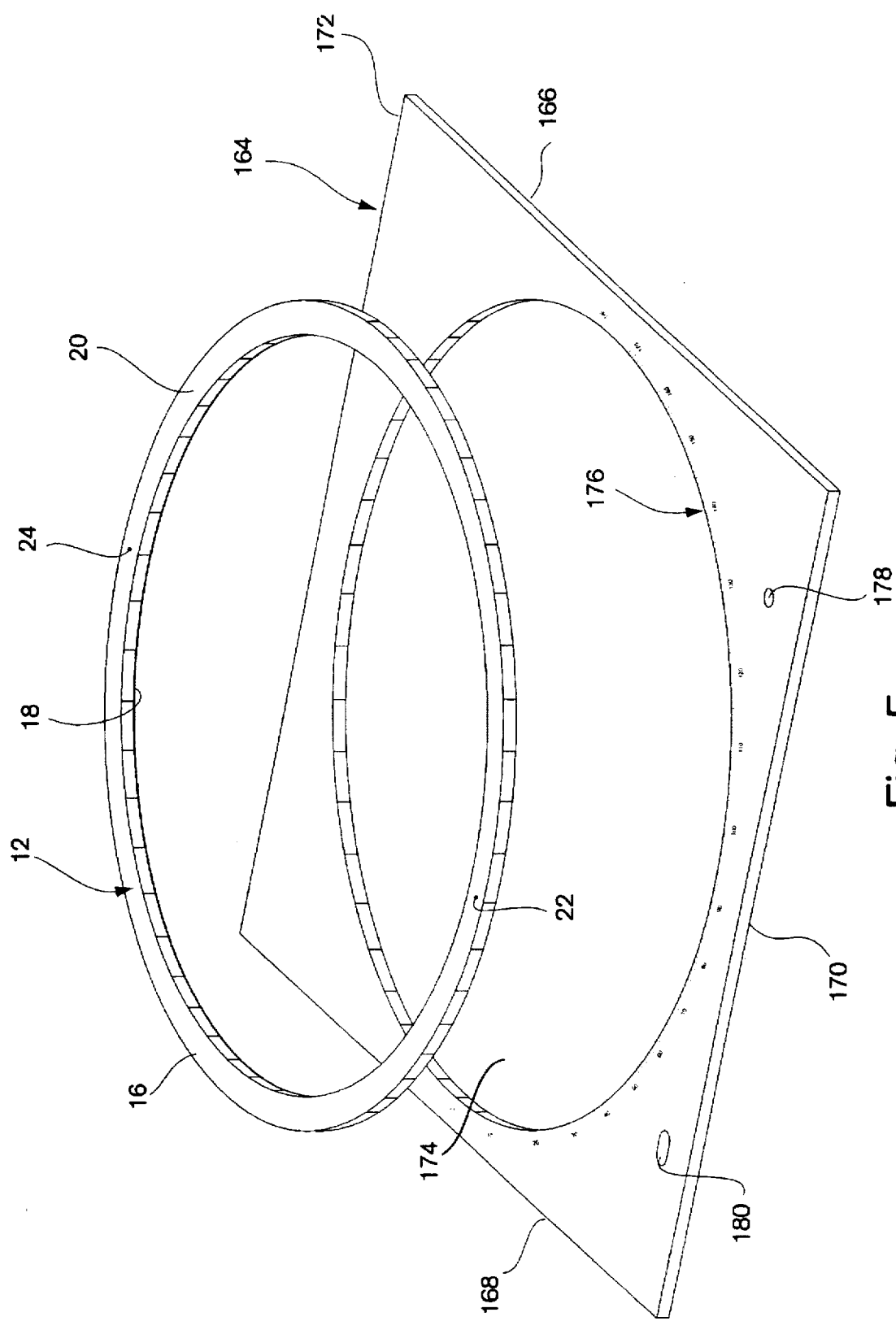
FIG. 5 is an exploded view in perspective showing a silk-screen comprising a circular-shaped woven mesh screen (not shown) adhered to an annular-shaped screen frame in a carrier for use in the determination of the angle at which moiré can be eliminated or at least minimized or localized.

A silk-screen carrier 164 of planar configuration, as shown in FIG. 5, is then mounted to the moiré detection apparatus 138. The carrier 164 is defined by side edges 166, 168, in parallel disposition to one another and by parallel end edges 170, 172 which intersect at 90° with the side edges. The carrier 164 is further defined by a circular-shaped opening 174, the diameter of which is only slightly greater than the outer diameter of the annular-shaped screen frame 16. The circular-shaped opening 174 defines a circular-shaped peripheral edge along a portion of which is provided a scale 176, as shown in FIG. 5. The scale is conveniently divided into one degree marks (1°–180°) and is located adjacent the bottom end edge 170. Nevertheless, it will be understood, if desired, that the scale can be located adjacent the top end edge 172, or for that matter that the scale can be a full 360 degrees.

Importantly, there are provided in the carrier 164, two openings 178, 180, these being spaced apart from one another to the same extent as the pins 160, 162 provided on the fop closure of the body member 140 (FIG. 4). Thus, when the carrier 164 is placed on the top closure, the carrier will be provided in square disposition with the body member of the moiré detection apparatus, the linear side edges 168, 168 of the carrier being in parallel disposition to the parallel side walls 142, 144 of the body member 140. The carrier 164 can be mounted to the body member 140 prior to placing the color film positive (not shown in the drawing) on the plate glass window, if desired. Nevertheless, this is less preferred as it proves somewhat more difficult to place the color film positive in the proper registration and to tape it in place.

Next, one of the circular-shaped screens 12, manufactured as earlier disclosed, is located in the carrier 164, being placed on top of the color film positive, with the mesh side down. Quite advantageously, any one of the screens 12 made, as earlier disclosed, can be used in this determination. The diameter of the circular-shaped opening 174 in the carrier is only slightly greater than the outer diameter of the annular-shaped screen frame 12. Thus, the screen frame will be freely rotatable relative to the periphery of the opening 174. Importantly, the location of the circular-shaped opening in the carrier and the location of the registration pins 160, 162 provide the circular-shaped screen (not shown in the drawing) concentric to the opening 154 in the top closure 152. Thus, the color film positive will be centrally located with respect to the screen. If will be recalled that either the warp or weft threads of the woven fabric screen are in parallel disposition to the index marks 22, 24. Thus, in placing the silk-screen 12 in the carrier 164, the screen frame is first rotated so that the lines of mesh in the screen defined by the warp and weft threads, and this is a critical feature of the invention, are first aligned to be square with the linear side edges 166, 168 of the carrier 164. Thus, with respect to the carrier shown in FIG. 5, the index mark 22 will be located at the 90° mark on the scale. Although the scale shown in FIG. 5 is from 0° at 9 o'clock to 180° at 3 o'clock, it will be appreciated by those skilled in the art that the scale may read from the opposite direction, if desired. Alternatively, if desired, the scale can read 0° at 6 o'clock and from 0° to 90° to 3 and 9 o'clock, respectively.

Next, the circular-shaped silk-screen 12 is then rotated by hand slowly in the carrier opening 174 in a clockwise direction to determine at what angle moiré is eliminated or at least reduced or localized for that particular color separation. The rotation of the screen frame can be facilitated, if desired, by providing a threaded opening (not shown) in the top surface of the screen frame. A threaded handle or protuberance can then be located in the threaded opening to aid the rotation of the screen frame and then subsequently removed, when desired. Focus, during rotation of the silk-screen frame, should be maintained upon a small part of the visual field provided by the opening 154 in the top closure of the body member 140 whereby moiré can be more readily detected by the human eye. If one focuses on the image seen in the entire visual field, it is somewhat difficult, at times, to interpret the moiré pattern as it changes with rotation of the silk-screen. It will be appreciated that the silk-screen 12 rotates independently of the color film positive which is in a fixed location on the top closure 152.

As the circular-shaped silk-screen 12 is rotated, moiré is seen to be eliminated or at least becomes minimal or undetectable by the human eye for that particular color separation. Once this point is reached, an index mark is provided on the screen frame at 6 o'clock, i.e., at the 90° index mark on the carrier scale. This mark can take various forms, one being a pressure-sensitive adhesive tape in the form of an arrow. Thus, the angle determined by the index mark 22 and the arrow mark is the angle that the mesh lines in the stretched woven fabric in the silk-screen should be provided, relative to the linear side edges of the carrier to eliminate or at least minimize or localize moiré. If desired, the silk-screen 12 can be locked in place in the carrier 164 by locking means provided on the carrier. The locking means can be like that earlier disclosed for carrier 14, or different, as desired. Alternatively, the angle that index mark 22 on the silk-screen frame makes with the scale 176 provided on the carrier can be read. The difference between this angle and the angle of the index mark 22 initially (FIG. 5) is then determined. It will be appreciated by those skilled in the art that this angle is the same as that determined by the arrow marker placed at 6 o'clock. In this case, a scale will need be provided also on the carrier 14 (FIG. 1). Whatever the manner of "remembering" the angle at which moiré is eliminated or at least minimized or localized, it is important that this angle be retained for later use. The carrier 164 and silk-screen 12 are then removed from the moiré defection apparatus 138 and the woven fabric silk-screen is provided with photosensitive emulsion according to usual techniques.

The other color film positives are then each, in turn, in like manner as earlier described, placed on the plate glass window 156, taped down, a carrier 164 is located in place, and a silk-screen 12 placed in the carrier. The silk-screens in each instance are rotated and the angle at which moiré is eliminated or at least minimized or reduced for each of the color film positives is determined in a manner as earlier disclosed. Thus, the angle at which moiré is at least minimal or localized for each of the silk-screens to be used in the particular half-tone printing process is determined. The circular-shaped silk-screens, while still locked in place in their respective carriers 164 at the angle at which moiré has been eliminated or at least minimized or localized for that particular color separation, are then each coated with a photosensitive emulsion in conventional manner. Although mechanical locking means can be used for locking the screen frame in place relative to the carrier, in some cases, the index marker provided at 6 o'clock, as earlier disclosed, can be used as both a marker and locking means. For example, a length of pressure-sensitive adhesive tape having a straight edge can be used to mark the 6 o'clock location on the screen frame, such tape being of sufficient length to extend onto and be attached to the top surface of the carrier 164.

Meanwhile, while the silk-screens 12 are each being coated with the photosensitive emulsion, the four color film positives, in the case of four color process printing, are registered relative to one another. The registration of the color film positives to one another is facilitated by use of a carrier mask (not shown in the drawings) of planar configuration and defined by a frame of square shape. To this carrier mask there is detachably secured a clear 7 mil MYLAR polyester film measuring the same size as the frame. Such a film thickness is desirable as it will provide stability to the film and the film will not shrink on being heated. The polyester film is provided at its bottom edge with two openings, these corresponding in location to two openings provided in the frame of the carrier mask. The frame openings, as are those in the polyester film, are of a diameter and so located as to fit onto the registration pins 160, 162 provided on the top closure of the body member 140 of the moiré detection apparatus 138, as earlier disclosed. In the center of the carrier mask film, there is provided a 5¼" circular-shaped opening, the purpose for which will soon be made clear. It will be appreciated by those skilled in the art that this opening is of the same diameter as the plate glass window 156 provided in the opening 154 in the top closure of the body member, and concentric therewith.

Although not earlier disclosed, it will be seen by reference to FIG. 4, that a plurality of small openings 182 are provided around the peripheral edge 158 of the opening 154. These openings 182 communicate with the internal cavity provided in the body member 140 defined by the vertically disposed end and side edges and the top and bottom closures. Also communicating with the cavity is a conventional vacuum pump (not shown), the purpose for which will soon be clear.

One of the film positives, having previously been provided with crop or registration marks in usual manner at 90 degrees to one another, e.g., af 3, 6, 9, and 12 o'clock, is placed at 90 degrees to the plate glass 156, i.e., square to the body member, emulsion side down. The color film positive is held in place by vacuum. Next, one of the carrier masks is located on the registration pins 160, 162. This carrier mask is taped to the underlying color film positive. The second color film positive is positioned on top of the first carrier mask placed down and the second color film positive is visually aligned with the first color film positive. The second color film positive is then lightly taped, i.e., so if can later be detached from the first color film positive and carrier mask therefor, to the first color film positive and first carrier mask. The second carrier mask is then placed on the registration pins 160, 162. Thus, it is positioned over the second color film positive and in registration with the first carrier mask. The second carrier mask is then taped to the second color film positive. The third color film positive is then placed on top of the second carrier mask and this color film positive is visually aligned to the first and second color film positives and taped lightly in position to the second color film positive and second carrier mask. This process of alignment and attachment of color film positives to carrier masks continues until each of the color film positives is provided in registration with the others, each color film positive being taped to a respective carrier mask and a color film positive being lightly taped to the color film positive below it and to its carrier. Thus, there is provided a "sandwich" comprising, in the case of four color process printing, four alternating color film positives and four carrier masks, the color film positives being in registration one with the other. The sandwich is then taken apart so that a single color film positive is associated with a single carrier mask. This can readily be done as the alternating color film positives are only lightly taped to an underlying color film positive and carrier mask.

The sequence in which the color film positives are provided in registration with one another is of no particular significance. It is important, however, that the central portion of the color film positive be so located as to show through the opening provided in the carrier mask. As the openings in the carrier masks are each centrally located and coincide with the circular-shaped plate glass 156 and opening 154 in the top closure 152 of the body member 140, the central portion of each of the color film positives will be superimposed one above the other and in a coinciding relationship.

Thus, In the case of four color process printing, a set of four color process film positives are provided. Each member of the set can then be used in providing an Image on a circular-shaped silk-screen, as earlier disclosed, and according to usual technique. Each carrier mask from the set (with a color film positive taped thereto) is then provided with a pin member or metal tab in each of the openings provide in the carrier mask, as earlier disclosed. Such a tab has an elongated pin having essentially the same diameter as the opening in a carrier mask, but being insertable therein, and a flat holding member, the plane of which extends perpendicular to the length of the pin.

The pinned carrier masks are each then provided in combination with a respective carrier 164 in which is located a circular-shaped screen 12 previously provided with a coating of photosensitive emulsion. This is accomplished by locating the pin member of the pinned carrier mask in the holes provided in the silk-screen carrier, as earlier disclosed. It is, of course, of critical importance that the mesh of the circular-shaped screen located in that carrier has been oriented in the proper angle relative to the linear side edges of the carrier for the elimination or at least the localization or minimizing of moiré in the silk-screen printing of that particular color. The emulsion on the silk-screens is then exposed to light and the carrier mask is removed from the carrier. The unexposed areas of the emulsion are then washed away in conventional manner. The silk-screens are then ready to be used in the silk-screen printing of the artwork or information involved.

Importantly, the silk-screens 12 with the exposed photosensitive emulsions thereon are then each removed from the moiré detection carriers i.e. carriers 164, and are placed in nesting screen carriers, i.e., screen carriers 14. These two carriers are of similar configuration; however, there are also important differences, as can readily be seen from FIGS. 1 and 5. The screen carder 14, instead of being provided with a scale, as is screen carrier 164, is merely provided with an index mark 182, this mark being located at 6 o'clock, as shown in the drawing. Furthermore, the screen carrier 14 is provided with cut-outs, as indicated by reference numeral 184. Cut-outs of a different configuration, may need be provided to accommodate the configuration of the particular print heart nest (not shown) but well known to those skilled in the art of silk-screen printing. In anticipation of making a printing run, the silk-screens 12 are located in the openings 38 of the carriers 14, the one end of the screen frame 16 being located below the stop member 48. The bottom surface of the screen frame will rest upon the top surface of the tabs 40, 42 and be supported thereby. Although not shown in the drawing additional tabs can be provided to support the screen frame, if desired.

Of critical importance, the screen frame in either of the carriers must be freely rotatable whereby to determine, and then provide the mesh of the woven fabric screen at, the desired angle to eliminate or af least minimize or localize moiré. The angle of the mesh in carrier 14, relative to its side edges must be the same as the angle of the mesh relative to the side edges of carrier 164, determined, as earlier disclosed, in the moiré detection device 138. Thus, the arrow index mark provided on the screen frame at 6 o'clock in the moiré detection process must be aligned with the index mark 182, provided at 6 o'clock in the carrier 14. Thus, the mesh in the silk-screens will each be located af the correct angle to eliminate or af least minimize or localize moiré in the artwork or graphics silk-screen printed on the printed object.

Quite advantageously, with the color film positives each being taped to a carrying mask and at the correct angle for registration of the film positives with one another, silk-screens can readily be re-imaged, as and when desired. Those skilled in the art will be appreciative of the fact that the films should each be attached to a carrying mask by a permanent transparent tape, to assure no movement or shrinkage of the tape while the carrier mask and attached color film positive are being stored for possible later use.

As will be understood by those skilled in the art, various modifications and changes can be made in the invention and its form and construction without departing from the spirit and scope thereof. The embodiments of the invention disclosed herein are merely exemplary of the various modifications that the invention can take and the preferred practice thereof. If is not, however, desired to confine the invention to the exact construction and features shown and desired herein, but if is desired to include all such as properly come within the spirit and scope of the invention disclosed and claimed.

We claim:

1. Silk-screen member for use in the printing of halftones on a flat planar surface comprising the combination of a silk-screen comprising an annular-shaped screen frame of predetermined inner and outer diameters, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge.

2. Silk-screen member according to claim 1, further comprising means being provided along said peripheral edge to prevent said annular-shaped screen frame from falling through the circular-shaped opening.

3. Silk-screen member according to claim 2 wherein the silk-screen further comprises a circular-shaped woven fabric defined by a plurality of warp and weft threads, and the annular-shaped screen frame is further defined by top and bottom planar surfaces, the circular-shaped woven fabric being adhesively secured to the top planar surface of the screen frame and the top planar surface of the screen frame facing downwardly in the carrier.

4. Silk-screen member according to claim 2 wherein the carrier for the silk-screen is of a square shape and the opening in the carrier is centrally disposed.

5. Silk-screen member according to claim 4 wherein first and second openings are provided in the carrier in predetermined spaced apart locations, said first and second openings being provided of a size and shape and being spaced-apart from one another a distance and in a location on the carrier so as to be placeable directly into a nest of a silk-screen printing head of a silk-screen printing apparatus on set-up.

6. Silk-screen member according to claim 1 further comprising two spaced apart vertically disposed openings being provided in the carrier inwardly from said front end edge and extending from the top planar surface to the bottom planar surface of the carrier, said openings being of a size and shape and being spaced apart and so located inwardly from said linear front end edge as to allow the silk-screen member to be placed directly in a nest of a silk-screen printing heart on setup.

7. Silk-screen member for use in the printing of halftones on a flat planar surface comprising the combination of a silk-screen comprising an annular-shaped screen frame of predetermined inner and outer diameters, said screen frame being defined by top and bottom planar surfaces, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, means being provided along said peripheral edge to prevent said annular-shaped screen frame from falling through the circular-shaped opening, said silk-screen further comprising a circular-shaped fabric defined by each of a plurality of warp and weft threads, the circular-shaped woven fabric being adhesively secured to the top planar surface of the screen frame and facing downwardly in the carrier, and means provided on the screen frame and carrier for indexing the location of the screen frame relative to the carrier whereby one of said plurality of warp and weft threads is provided at a predetermined angle relative to said linear side edges of the carrier.

8. Silk-screen member according to claim 7 wherein said indexing means provided on said screen frame comprises two indexing means being provided on the bottom planar surface of the screen frame in opposition to one another on a diameter of the screen frame and at least one of said plurality of warp and weft threads are provided in parallel disposition to a diameter of the screen frame, and to said two indexing means provided on the bottom planar surface of the screen frame.

9. Silk-screen member for use in the printing of halftones on a flat planar surface comprising the combination of a silk-screen comprising an annular-shaped screen frame of predetermined inner and outer diameters, said screen frame being defined by top and bottom planar surfaces, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, means being provided along said peripheral edge to prevent said annular-shaped screen frame from falling through the circular-shaped opening, said silk-screen further comprising a circular-shaped woven fabric defined by each of a plurality of warp and weft threads, said circular-shaped woven fabric being adhesively secured to the top planar surface of the screen frame and facing downwardly in the carrier, and indexing means being provided on the screen frame and carrier, said indexing means being provided on the carrier comprising an indexing mark being provided between the linear side edges of the carrier and along the front end edge, and said indexing means being provided on the screen frame comprising two indexing means being provided on the bosom planar surface of the annular-shaped screen frame in opposition to one another and on a diameter of said screen frame, the indexing means provided on the screen frame being in operative association with the index mark provided on the carrier and one of said plurality of warp and threads is provided at a predetermined angle relative to said linear side edges of the carrier.

10. Silk-screen member according to claim 9 wherein locking means are provided on one of said annular-shaped screen frame and carrier and said locking means is provided in operative association with the annular-shaped screen frame and carrier so that the carrier and screen frame are locked in a certain location relative to the indexing mark provided on the carrier.

11. Silk-screen member for use in the printing of halftones on a flat planar surface comprising the combination of a silk-screen comprising an annular-shaped screen frame of predetermined inner and outer diameters and being defined by top and bottom planar surfaces, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, means being provided along said peripheral edge to prevent said annular-shaped screen frame from falling through the circular-shaped opening, said silk-screen further comprising a circular-shaped woven fabric defined by a plurality of warp and weft threads adhesively secured to said top planar surface of the screen frame and the top planar surface of the screen frame facing downwardly in said carrier, indexing means being provided on said screen frame and carrier, said indexing means provided on said screen frame comprising two indexing means being provided on the bottom planar surface of the screen frame in opposition to one another on a diameter of the screen frame and at least one of said plurality of warp and weft threads being provided in parallel disposition to a diameter of the screen frame, and to said two indexing means provided on the bottom planar surface of the screen frame.

12. Silk-screen member according to claim 11 wherein the indexing means provided on the screen frame comprises indexing marks being provided on the top and bottom planar surfaces of the screen frame in opposition to one another and lying on a diameter of the screen frame, the indexing marks being provided on the bottom surface of the screen frame lying on the same diameter as those indexing marks provided on the top surface.

13. Silk-screen member according to claim 11 further comprising two spaced apart vertically disposed openings being provided in the carrier inwardly from said front end edge and extending from the top planar surface to the bottom planar surface of the carrier, said openings being of a size and shape and being spaced apart and so located inwardly from said linear front end edge as to allow the silk-screen member to be placed directly in a nest of a silk-screen printing heart on setup.

14. Silk-screen member according to claim 11 wherein the means for preventing said annular-shaped screen frame from falling though said circular-shaped opening further comprises at least two tabs being provided on the carrier and extending inwardly from the peripheral edge of the circular-shaped opening, a top planar surface being provided on each of said at least two tabs, said top planar surfaces of the said at least two tabs being provided in the same plane below and parallel to the top planar surface of the carrier whereby the annular-shaped screen is prevented from falling through the circular-shaped opening and the woven fabric of the silk-screen is provided in the same plane as the bottom planar surface of the carrier.

15. Silk-screen member according to claim 14 wherein the silk-screen member further comprises a stop member being fixedly provided on the top planar surface of the carrier in opposition to said at least two tabs, said stop member extending across the circular-shaped opening of the carrier and being in contact with the bottom planar surface of the annular-shaped screen frame whereby the stop member and said at least two tabs maintain the bosom planar surface of said annular-shaped screen frame in the same plane as the top planar surface of the carrier.

16. Silk-screen member for use in the printing of halftones on a flat planar surface comprising the combination of a silk-screen comprising an annular-shaped screen frame of predetermined inner and outer diameters, said screen frame being defined by top and bottom planar surfaces, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, means being provided along said peripheral edge to prevent said annular-shaped screen frame from falling through the circular-shaped opening, said silk-screen further comprising a circular-shaped fabric defined by each of a plurality of warp and weft threads, the circular-shaped woven fabric being adhesively secured to the top planar surface of the screen frame and facing downwardly in the carrier, and indexing means being provided on the screen frame and carrier, said indexing means being provided on the carrier comprising an indexing mark being provided between the linear side edges of the carrier and along the front end edge, and said indexing means being provided on the screen frame comprising two indexing means being provided on the bottom planar surface of the annular-shaped screen frame in opposition to one another and on a diameter of said screen frame, the indexing means provided on the screen frame being in operative association with the index mark provided on the carrier and one of said plurality of warp and weft threads is provided at a predetermined angle relative to said linear side edges of the carrier.

17. Silk-screen member according to claim 16 wherein locking means are provided on one of said annular-shaped screen frame and carrier and said locking means is provided in operative association with the annular-shaped screen frame and carrier so that the carrier and screen frame are locked in a certain location relative to the indexing mark provided on the carrier.

18. Silk-screen member according to claim 16 wherein the indexing mark provided on the carrier is at the mid-point between the linear side edges along the front end edge.

19. Silk-screen member according to claim 18 wherein the annular-shaped screen frame is rotated in said circular-shaped opening relative to the peripheral edge of said circular-shaped opening provided in the carrier and said two indexing means on the screen frame are provided in operative association with the indexing mark provided on the carrier whereby to provide said one of said plurality of warp and weft threads of the woven fabric at a predetermined angle relative to the linear side edges of the carrier.

20. Silk-screen member according to claim 19 wherein locking means are provided in operative association with the annular-shaped screen frame and carrier so that the screen frame can be locked in a certain location relative to the indexing mark on the carrier.

21. Silk-screen member for use in the printing of halftones on a flat planar surface comprising the combination of a silk-screen comprising an annular-shaped screen frame of predetermined inner and outer diameters, said screen frame being defined by top and bottom planar surfaces, and a carrier for the silk-screen, said carrier being defined by top and balsam planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, means being provided along said peripheral edge to prevent said annular-shaped screen frame from falling through the circular-shaped opening, said silk-screen further comprising a circular-shaped woven fabric defined by each of a plurality of warp and weft threads, the circular-shaped woven fabric being adhesively secured to the top planar surface of the screen frame and facing downwardly in the carrier, and indexing means being provided on the screen frame and carrier whereby one of said plurality of warp and weft threads is provided at a predetermined angle relative to said linear side edges of the carrier, said indexing means provided on said screen frame comprising two indexing means being provided on the bosom planar surface of the screen frame in opposition to one another on a diameter of the screen frame and at least one of said plurality of warp and weft threads being provided in parallel disposition to a diameter of the screen frame, and to said two indexing means provided on the bottom planar surface of the screen frame.

22. Silk-screen member for use in the printing of halftones on a flat planar surface comprising the combination of a silk-screen comprising an annular-shaped screen frame of predetermined inner and outer diameters, and a carrier for the silk-screen, said carrier being defined by top and bottom planar surfaces and by linear side edges and linear front and back end edges, a circular-shaped opening being provided in said carrier defining a peripheral edge, the diameter of the circular-shaped opening being only slightly larger than the predetermined outer diameter of the annular-shaped screen frame whereby the screen frame is freely rotatable in said circular-shaped opening relative to said peripheral edge, and at least two tabs being provided on the carrier and extending inwardly from the peripheral edge of the circular-shaped opening, a top planar surface being provided on each of said at least two tabs, said top planar surfaces of the said at least two tabs being provided in the same plane below and parallel to the top planar surface of the carrier whereby the annular-shaped screen is prevented from falling through the circular-shaped opening and a woven fabric of the silk-screen is provided in the same plane as the bottom planar surface of the carrier.

23. Silk-screen member according to claim 22 wherein the annular-shaped screen frame is further defined by top and bottom planar surfaces and the silk-screen member further comprises a stop member being fixedly provided on the top planar surface of the carrier in opposition to said at least two tabs, said stop member extending across the circular-shaped opening of the carrier and being in contact with the bottom planar surface of the annular-shaped screen frame whereby the stop member and said at least two tabs maintain the bottom planar surface of said annular-shaped screen frame in the same plane as the top planar surface of the carrier.

24. Silk-screen member for use in a multicolor printing process comprising the combination of a silk-screen comprising an annular-shaped screen frame of predetermined inner and outer diameters, said annular-shaped screen frame being defined by top and bottom planar surfaces, a circular-shaped woven fabric adhesively secured to the top planar surface of said screen frame, a plurality of warp and weft threads defining said woven fabric, a carrier for said silk-screen, top and bottom planar surfaces being provided on said carrier and said carrier being defined by linear, parallel, side edges and linear, parallel front and back end edges, a circular-shaped opening being provided in said carrier, a peripheral edge defining said circular-shaped opening, the diameter of the circular-shaped opening being only slightly larger than the predetermined outer diameter of the annular-shaped screen frame whereby the screen frame is freely rotatable in said circular-shaped opening relative to said peripheral edge, the top planar surface of the screen frame facing downwardly in said carrier, means being provided along said peripheral edge to prevent said annular-shaped screen frame from falling through the circular-shaped opening, indexing means being provided on the screen frame and carrier whereby one of said plurality of warp and weft threads of said woven fabric is provided at a predetermined angle relative to said linear side edges of the carrier.

25. Silk-screen member according to claim 24 wherein said indexing means provided on said annular-shaped screen frame comprises two indexing means being provided on the bottom planar surface of the annular-shaped screen frame in opposition to one another on a diameter of the annular-shaped screen frame and at least one of said plurality of warp and weft threads of said woven fabric are provided in parallel disposition to a diameter of the annular-shaped screen frame, and to said two indexing means provided on the bottom planar surface of the annular-shaped screen frame.

26. Silk-screen member according to claim 25 wherein the indexing means provided on the annular-shaped screen frame comprises indexing marks being provided on the top and bottom planar surfaces of the annular-shaped screen frame in opposition to one another and lying on a diameter of the annular-shaped screen frame, the indexing marks being provided on the bottom surface of the annular-shaped screen frame lying on the same diameter as those indexing marks provided on the top surface.

27. Silk-screen member according to claim 24 wherein the indexing means provided on the carrier comprises an indexing mark provided on the carrier at the mid-point between the linear side edges along the front end edge.

28. Silk-screen member according to claim 27 wherein the annular-shaped screen frame is rotatable in said circular-shaped opening relative to the peripheral edge of said circular-shaped opening provided in the carrier said indexing means provided on the screen frame comprising two indexing marks provided in opposition to one another on a diameter of the annular-shaped screen frame and said two indexing marks on the screen frame are provided in operative association with the indexing mark provided on the carrier whereby to provide said one of said plurality of warp and weft threads of the woven fabric at a predetermined angle relative to the linear side edges of the carrier.

29. Silk-screen member according to claim 28 wherein locking means are provided in operative association with the annular-shaped screen frame and carrier so that the screen frame can be locked in a certain location relative to the indexing mark on the carrier.

* * * * *